(12) United States Patent
Valliappan et al.

(10) Patent No.: US 12,401,346 B2
(45) Date of Patent: Aug. 26, 2025

(54) EFFICIENT ARCHITECTURE FOR HIGH-PERFORMANCE DSP-BASED LONG-REACH SERDES

(71) Applicant: Avago Technologies International Sales Pte. Limited, Singapore (SG)

(72) Inventors: Magesh Valliappan, Austin, TX (US); Adam Healey, Newburyport, MA (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 3 days.

(21) Appl. No.: 18/541,643

(22) Filed: Dec. 15, 2023

(65) Prior Publication Data

US 2025/0202458 A1    Jun. 19, 2025

(51) Int. Cl.
*H03H 21/00* (2006.01)
*H03H 17/02* (2006.01)
*H03H 17/00* (2006.01)

(52) U.S. Cl.
CPC .... *H03H 21/0067* (2013.01); *H03H 17/0294* (2013.01); *H03H 2017/0081* (2013.01); *H03H 2021/0092* (2013.01)

(58) Field of Classification Search
CPC .......... H03H 21/0067; H03H 17/0294; H03H 2017/0081; H03H 2021/0092
USPC ................................................. 375/232–233
See application file for complete search history.

(56) References Cited

U.S. PATENT DOCUMENTS

| | | | |
|---|---|---|---|
| 7,177,352 B1 | 2/2007 | Plasterer et al. | |
| 9,485,058 B2* | 11/2016 | Riani | H04L 1/004 |
| 10,880,130 B1* | 12/2020 | Hidaka | H04L 25/03878 |
| 12,074,961 B1* | 8/2024 | De Bernardinis | H04L 7/0016 |
| 2007/0297499 A1* | 12/2007 | de Victoria | H04L 25/03133 |
| | | | 375/232 |
| 2011/0142120 A1* | 6/2011 | Liu | H04L 25/03885 |
| | | | 375/233 |
| 2017/0111189 A1* | 4/2017 | Fine | H04L 5/005 |
| 2021/0306009 A1* | 9/2021 | Riani | H03M 13/09 |

FOREIGN PATENT DOCUMENTS

EP    4167535 A1    4/2023

OTHER PUBLICATIONS

European Patent Office, Extended Search Report, Application No. 24218741.7, May 15, 2025, 15 pages.

* cited by examiner

*Primary Examiner* — Emmanuel Bayard
(74) *Attorney, Agent, or Firm* — Quarles & Brady LLP

(57) ABSTRACT

A digital signal processing (DSP)-based serializer-deserializer (SERDES) includes a first filter configured to mitigate inter-symbol interference (ISI) attributed to dispersion associated with a long-reach transmission medium. The SERDES includes a second filter configured to shape the ISI. The SERDES includes also includes a third filter coupled in parallel with the second filter and configured to reduce ISI attributed to reflections associated to both near-zero delays and long delays.

20 Claims, 6 Drawing Sheets

EFFICIENT ARCHITECTURE FOR HIGH-PERFORMANCE DSP-BASED LONG-REACH SERDES

FIELD OF INVENTION

The present description relates generally to high-speed serial communications links and, in particular, to an efficient architecture for a high-performance digital signal processing (DSP)-based long-reach serializer-deserializers (SERDES).

BACKGROUND OF THE INVENTION

High speed digital signal processing (DSP)-based serializer-deserializers (SERDES) require sophisticated algorithms to operate over densely populated and low-cost channels while maintaining high efficiency to reduce power usage and chip area. This is particularly true in highly integrated large application-specific integrated circuit (ASIC) applications. Conventional DSP receivers can have a long feed-forward equalizer (FFE) with many taps (controlled filter coefficients) and a short 1-2 tap decision-feedback equalizer (DFE). Practical channels have reflections that need equalization at long delays, which in turn drive an increase in the FFE or DFE length. The input to the FFE usually has attenuated high-frequency content requiting more active taps to equalize a reflection. These factors increase power and area of the DSP. The complexity of these circuits results in longer latencies to obtain timing-related information such as received symbols and expected values to compare against, causing a loss of margin in highly integrated environments where tolerance to jitter is required. Sometimes a separate, shorter FFE, is dedicated to the timing recovery path to achieve reasonable, but sub-optimal signal quality, with lower latency. This approach, however, can add redundancy and complexity. A low-power, low-area architecture with reflection-cancellation and fast-timing recovery, while still retaining FFE-DFE-like noise shaping, is desired for low bit-error-rate applications.

For applications with long-reach transmission channels, the insertion loss increases, which may cause loss of performance margin for the DSP-based SERDES that used FFE to shape the signal to reduce inter-symbol interference (ISI). ISI in general refers to a situation in which signal overlap occurs, causing individual pulses (symbols) to interfere with one another. This interference happens when the duration of the channel's impulse response is longer than the symbol period. As a consequence, the tail of one pulse spills over into the subsequent time slots allocated for other pulses, which can lead to errors in symbol detection. On high loss channels in a long-reach transmission medium, significant amounts of ISI must be reduced which requires more FFE taps, which will increase power and device area. Even with additional taps, a compromise between ISI and noise results in residual ISI being left behind, particularly, those near-zero delay ISI. A DFE may be used to perform ISI cancelation without noise enhancement. Unlike a feed-forward equalizer (FFE), which only uses past received symbols to form an estimate of the current symbol, a DFE uses past received symbols as well as previous decisions (estimates) about the transmitted symbols. But the process is limited to post-cursor (or positive delay) ISI. Therefore, an improved high-speed DSP for long-reach SERDES is desired for reducing these residue ISI without noise enhancement and reducing hardware cost in number of FFE taps.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
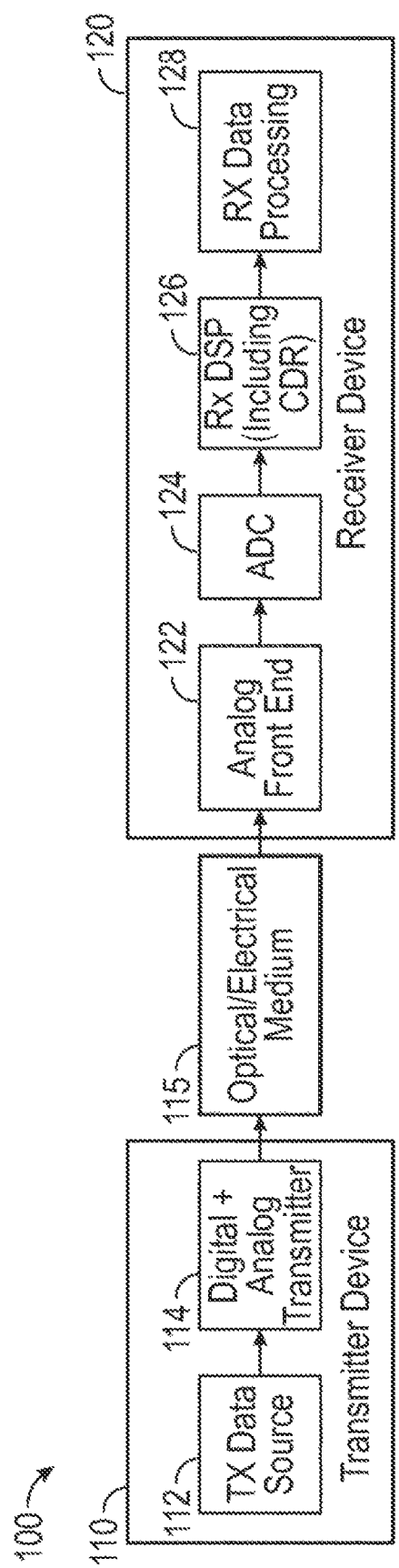
FIG. 1 is a block diagram illustrating an example of a serializer-deserializer (SERDES) link within which the high-performance digital signal processing (DSP) of the subject technology is implemented.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block diagram form in order to avoid obscuring the concepts of the subject technology.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element (including but not limited to electrical or communicative connection or coupling), it is to be understood that the element can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the element can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other instances in which intervening elements may be present.

Similarly, when an element is referred to herein as being "bonded" to another element, it is to be understood that the element can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

The subject technology is directed to an efficient architecture for a high-performance digital signal processing (DSP)-based serializer-deserializer (SERDES). The disclosed technology provides a low-power, low-area architecture with reflection-cancellation and fast-timing recovery, while retaining feed-forward equalizer (FFE) and decision-feedback equalizer (DFE) like noise shaping for low bit-error-rate (BER) applications. Instead of a single stage FFE, the disclosed solution implements the FFE as a cascaded combination of three filters and an optional interpolator. In some implementations, the three filters include a receive (RX)-FFE filter, a reflection canceller (RC) finite impulse-response (FIR) filter and a noise-shaping partial-response (PR) FIR filter.

The short RX-FFE filter, implemented at low latency, targets a unit tap equalized response. The equalized response has less dynamic range across channels and allows more aggressive bit-width reduction for downstream stages. The short RX-FFE filter output is provided for timing recovery and can be readily sliced into symbols' expected values and provides a low-latency timing error for clock-and-delay recovery (CDR) without the implementation delays of a long FFE or DFE. The output is also quantized and used as the input to a floating tap structure to cancel reflections. This signal is already equalized by the RX-FFE, resulting in fewer active taps to cancel reflections. The quantized input has a narrow bit width resulting in low-cost delay lines and trivial multipliers that leads to low overall power and chip area. To obtain the benefit of noise shaping, RX FFE output is passed through a noise shaping filter and DFE filter to fix inter-symbol interference (ISI). To obtain an even faster timing-recovery, an interpolator can be inserted at the FFE output. The interpolator operates on a well-equalized input resulting in cost savings in bit resolutions for associated multipliers while still retaining all other capabilities.

A serializer-deserializer, commonly known as SERDES, is a key component in high-speed digital communication systems and computing. It plays a crucial role in facilitating the transfer of data between chips or devices, especially where high data rates and efficiency are essential. The serializer in a SERDES takes parallel data streams (where multiple bits are transmitted simultaneously on different channels) and converts them into a single, high-speed serial data stream. This process involves not just combining the data streams, but also typically includes encoding and adding clock information to ensure the receiver can recover the original data correctly. Conversely, the deserializer performs the opposite function. It takes the high-speed serial data stream and converts it back into parallel data streams. This process includes clock recovery, decoding, and aligning the incoming data to ensure it matches the original transmitted parallel data. One general aspect includes a device based serializer-deserializer (SERDES) for process the serial data stream in high-speed data communication system. The device also includes a first filter configured to process an input signal to reduce inter-symbol interference (ISI) associated with channel dispersion through a long-reach transmission medium. The device also includes a second filter coupled in series to the first filter and configured to change a shape of the ISI. The device also includes a third filter coupled in parallel with the second filter and configured to cancel isi associated with both long-delay reflections and near-zero delay reflections. Other embodiments of this aspect include corresponding computer systems, apparatus, and computer programs recorded on one or more computer storage devices, each configured to perform the actions of the methods.

Implementations may include one or more of the following features. The device where the first filter may include a feed-forward equalizer configured to include a calibration circuit to calibrate for a timing offset of the input signal received from an analog-to-digital converter (ADC) to provide a first intermediate signal for a serializer-deserializer (SERDES). The second filter may include a partial-response finite impulse-response (PRFIR) filter configured to introduce controlled ISI based on a transfer function, where the transfer function contains at least a term associated with added positive delay which corresponds to a negative delay implemented in the third filter. The device may include an interpolator configured to adjust a phase of the first intermediate signal outputted from the first filter to output a second intermediate signal based on a phase adjustment signal. The device may include a phase detector configured to detect a phase angle of the second intermediate signal from the interpolator, and a loop filter configured to generate the phase adjustment signal. The third filter may include a quantizer and a reflection-canceller finite impulse-response (RCFIR) filter coupled to the quantizer in series, the third filter being coupled to the interpolator and the first filter in parallel with the PRFIR filter. The RCFIR filter is configured to cancel reflections using multiple floating taps located from a near-zero negative delay timing point to positive delay timing point including long delay timing point. The device may include a fourth filter coupled in parallel with the RCFIR filter and configured to remove residue ISI attributed to analog noise. The device may include a delay-match circuit coupled to the PRFIR filter and followed by an adder, the delay-match circuit being configured to enable reduction of negative delay ISI performed in RCFIR filter, the adder being configured to combine a positive output of the second filter with a corresponding negative output of the third filter and the fourth filter and to generate an output signal. The device may include a fifth filter coupled to the adder, the fifth filter may include a decision-feedback equalizer (DFE) configured to process the output signal to remove the controlled ISI added by the second filter. Implementations of the described techniques may include hardware, a method or process, or computer software on a computer-accessible medium.

Another general aspect includes a system for high-performance DSP-based long-reach SERDES. The system also includes an analog-to-digital converter (ADC) configured to provide a digital signal converted from an analog signal transmitted through a transmission medium. The system also includes a first filter configured to reduce inter-symbol interference (ISI) of the digital signal associated with dispersion in the transmission medium. The system also includes a second filter configured to change spectral shape of the ISI. The system also includes a third filter configured to cancel ISI associated with reflections at various timing points in the transmission medium. The system also includes where the transmission medium may include a long-reach transmission medium, and the second filter is implemented in a serializer-deserializer (SERDES) with the first filter and in parallel with the third filter.

Implementations may include one or more of the following features. The system where the first filter may include a feed-forward equalizer (FFE) having an offset calibration to provide a first intermediate signal with equalized dispersion. The second filter may include a partial-response infinite impulse-response (PRFIR) filter configured to introduce controlled ISI based on a transfer function and add the controlled ISI to the first intermediate signal. The third filter may include a quantizer coupled in series with a reflection-canceller finite impulse-response (RCFIR) filter. The RCFIR filter is configured to reduce reflections using multiple floating taps located from a near-zero negative delay time point to a positive delay time points including long delays time points, where the taps associated with negative delays in the RCFIR filter are modeled by modifying taps with longer delay in the PRFIR filter. The system may include a fourth filter coupled in parallel with the third filter and configured to reduce residue ISI attributed to long-tail analog noise. The system further may include a delay-match circuit coupled to the PRFIR filter and followed by an adder, the delay-match circuit being configured to provide a controlled positive delay ISI through the PRFIR filter to enable reduction of negative delay ISI performed in RCFIR filter, the system may include a decision-feedback equalizer to remove the controlled ISI added by the PRFIR filter. Implementations of the described techniques may include hardware, a method or process, or computer software on a computer-accessible medium.

Yet another general aspect includes a serializer-deserializer (SERDES) receiver. The receiver also includes a feed-forward equalizer (FFE) configured to equalize signal dispersion associated with a transmission medium. The receiver also includes a filter configured to reduce both long-delay reflections and near-zero delay reflections attributed to inter-symbol interference (ISI) in the transmission medium. The receiver also includes a partial-response finite impulse-response (PRFIR) filter configured to add controlled ISI based on a transfer function. The receiver also includes an interpolator coupled to the FFE and configured to output a phase-adjusted signal to the PRFIR filter, where the transmission medium may include a serializer-deserializer (SERDES) long-reach transmission medium.

Implementations may include one or more of the following features. The receiver where the filter may include a quantizer and a reflection-canceller finite impulse-response (RCFIR) filter coupled in series, the filter being coupled in parallel with the PRFIR filter, where the transfer function includes a contribution from an added positive delay ISI which corresponds to a negative delay ISI processed by the RCFIR filter. The receiver may include an adder coupled to the PRFIR filter and the RCFIR filter and a decision-feedback equalizer (DFE) coupled to the adder, the adder being configured to process outputs from both the PRFIR filter and the RCFIR filter, the DFE being configured to remove the controlled ISI added by the PRFIR filter. Implementations of the described techniques may include hardware, a method or process, or computer software on a computer-accessible medium.

FIG. 1 is a block diagram illustrating an example of a SERDES link 100 within which the high-performance DSP of the subject technology is implemented. The SERDES link 100 includes a transmitter device 110, a transmission medium 115 and a receiver device 120. The transmitter device 110 includes a transmit (TX) data source 112 and a transmitter circuit 114. The TX data source provides data such as electrical or optical data to be transmitted to the receiver device 120. The transmitter circuit 114 includes digital and analog circuitry suitable for processing the data, such as amplifying and noise cancelling to prepare the data for transmission over the transmission medium 115. In some implementations, the transmitter circuit 114 may also include electro-optical circuitry. The transmission medium 115 can be an optical transmission medium consisting of optical fibers and fiber optics components or an electrical transmission medium consisting of twisted wires or coaxial cables and associated electrical circuitry.

The receiver device 120 includes an analog front-end (AFE) circuit 122, an analog-to-digital converter (ADC) circuit 124, a receiver (RX) DSP block 126 and a RX data processing block 128. The AFE circuit 122 may include low-noise amplifiers, filters and adjustable gain amplifiers and is responsible for amplification and noise reduction of the analog signal received from the transmission medium 115. The ADC circuit 124 converts the analog output signals of the AFE circuit 122 into digital signals that can be processed by the RX DSP block 126. The RX DSP block 126 includes a clock and data recovery (CDR) circuit to synchronize with and extract a clean clock signal from a digital data stream that may have timing variations. The last stage is the RX data processing block 128 that further processes the output data from the RX DSP block 126 to recover the original data for presentation on an output device, for example, for display on a display device. In some implementations, the SERDES link 100 may include an optional forward error correction (FEC) block (not shown for simplicity) that can be implemented in the transmitter device 110 (e.g., in the TX data source 112) or the receiver device 120 (e.g., the RX data processing block 128). The SERDES link 100 shows TX and RX in only one direction. A similar link can be used in the opposite direction, The RX DSP block 126 is the foundation of the receiver device 120 for which the subject technology provides efficient implementation architectures, as discussed herein.

Figure 2:
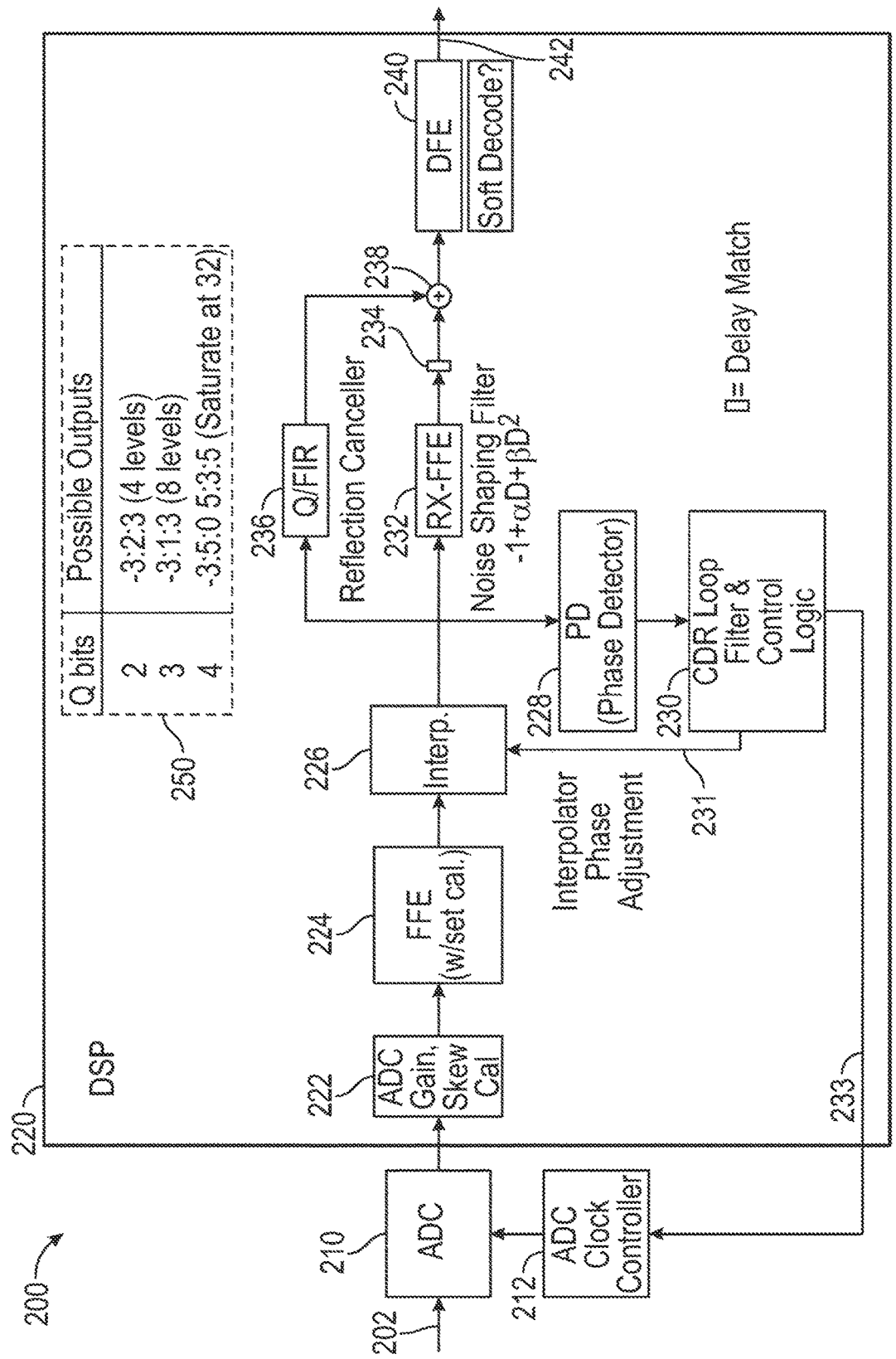
FIG. 2 is a block diagram illustrating an example of a high-performance DSP system, according to various aspects of the subject technology.

FIG. 2 is a block diagram illustrating an example of a high-performance DSP system 200, according to various aspects of the subject technology. The high-performance DSP system 200 includes a DSP device 220, an ADC 210 and an ADC clock controller 212. The ADC 210 is similar to the ADC circuit 124 of FIG. 1 and can receive analog data 202 from an AFE circuit (e.g., 122 of FIG. 1) and convert it to digital data for processing by the DSP system 200. The ADC clock controller 212 provides and controls the clock signals for the ADC 210.

The DSP device 220 includes an ADC calibration circuit 222, and FFE circuit 224, an interpolator 226, a phase detector (PD) 228, a CDR circuit 230 and RX FFE circuit 232, a delay-match circuit 234, a reflection canceller 236, a summing (or adder) circuit 238 and a DFE circuit 240. In some implementations, some components of the DSP device 220 can be implemented in software and/or firmware. The ADC calibration circuit 222 can be a gain-skew calibration circuit and is responsible for calibration of the timing offset (skew) and gain errors of the ADC 210. The FFE circuit 224 is an equalizer that is used to undo the channel dispersion associated with the transmission medium (e.g., 115 of FIG. 1) and may include offset calibration. Channel dispersion in telecommunications and signal processing refers to the phenomenon where different frequency components of a signal arrive at the receiver at different times. The cause of channel dispersion may include different modes of transmission medium, material-depended chromatic dispersion, different polarization states, and phase velocity variation in transmission medium. This temporal spreading of a signal's frequency components occurs as they travel through a channel, and it can cause significant issues in the transmission of information, especially at high data rates over long distances. The FFE circuit 224 can be implemented as a symbol-spaced FIR filter to reduce distortions due to, for example, channel loss impairments. In some aspects, the FFE circuit 224 can be implemented using multitap filters that create a number of delayed versions of the input signal that are added back to the signal with the proper weights. In some implementations, the FFE circuit 224 can include offset calibration to calibrate for a timing or voltage offset of the digital signal received from the ADC calibration circuit 222. The PD 228 can detect the phase angle of the interpolator output signal and provide it to the CDR circuit 230. The CDR circuit 230 may include a loop filter and control logic and generates interpolator phase adjustment signal 231 and control signal 233 that is used by the ADC clock controller 212.

The output of the interpolator 226 includes the original signal transmitted by the transmitter device (e.g., 110 of FIG. 1) plus the edge reflection effect due to the transmission medium (e.g., 115 of FIG. 1) and is ready for undoing the edge reflection effect by the next stage, including the RX-FFE 232 and the reflection canceller 236. The RX-FFE, 232 is a short equalizer implemented at low latency and can target a partial response for noise shaping. The RX-FFE 232 includes a noise-shaping filter that can change the spectral shape of a signal and can be characterized by a polynomial transfer function similar to $1+\alpha D+\beta D^2$, where D is a delay or latency variable and $\alpha$ and $\beta$ are parameters of the transfer function. The value of $\alpha$ is typically between 0 and 1 to implement a low-pass filter to reduce noise. The reflection canceller 236 consists of a quantizer (Q) followed by an FIR filter (also referred to as Q-FIR filter) with a floating tap structure. The quantized input to the FIR has a narrow bit width resulting in low-cost delay lines and simple multipliers that leads to low overall power usage and chip area. In other words, the use of the Q filter in front of the FIR filter allows using an FIR with a lower number of bits, for which possible outputs for different values (2, 3 and 4) of a Q bit is given in a table 250. The reflection canceller 236 can effectively cancel the effect of the channel impairments such as reflection signals that can occur when a signal is transmitted along the transmission medium (e.g., 115 of FIG. 1). The output signal from the RX-FFE 232 is delayed by the delay match circuit 234 and combined by the summing circuit 238 with the signal output of the reflection canceller 236 for timing recovery. The delay match circuit 234 accounts for the difference between the processing delays of the Q/FIR 236 and RX-FFE 232 paths so that the output of the summing circuit 238 is correct. The output signal from the summing circuit 238 is passed into a DFE circuit 240, which is a noise-shaping filter for suppression of quantization noise. DFE circuit 240 subtracts the terms $\alpha D + \beta D^2$ introduced by the RX-FFE using estimates of the transmitted symbols derived from the signal at its input. In this way the noise shaping benefits of the RX-FFE are realized without the penalty of the inter-symbol interference (ISI) it introduces. The DSP output signal 242 is a signal in which the channel dispersion and reflection effects are undone. The DSP output signal is sent to an RX data processing circuit (e.g., 128 of FIG. 1) to recover the original data transmitted by the transmitter device (e.g., 110 of FIG. 1).

Figure 3:
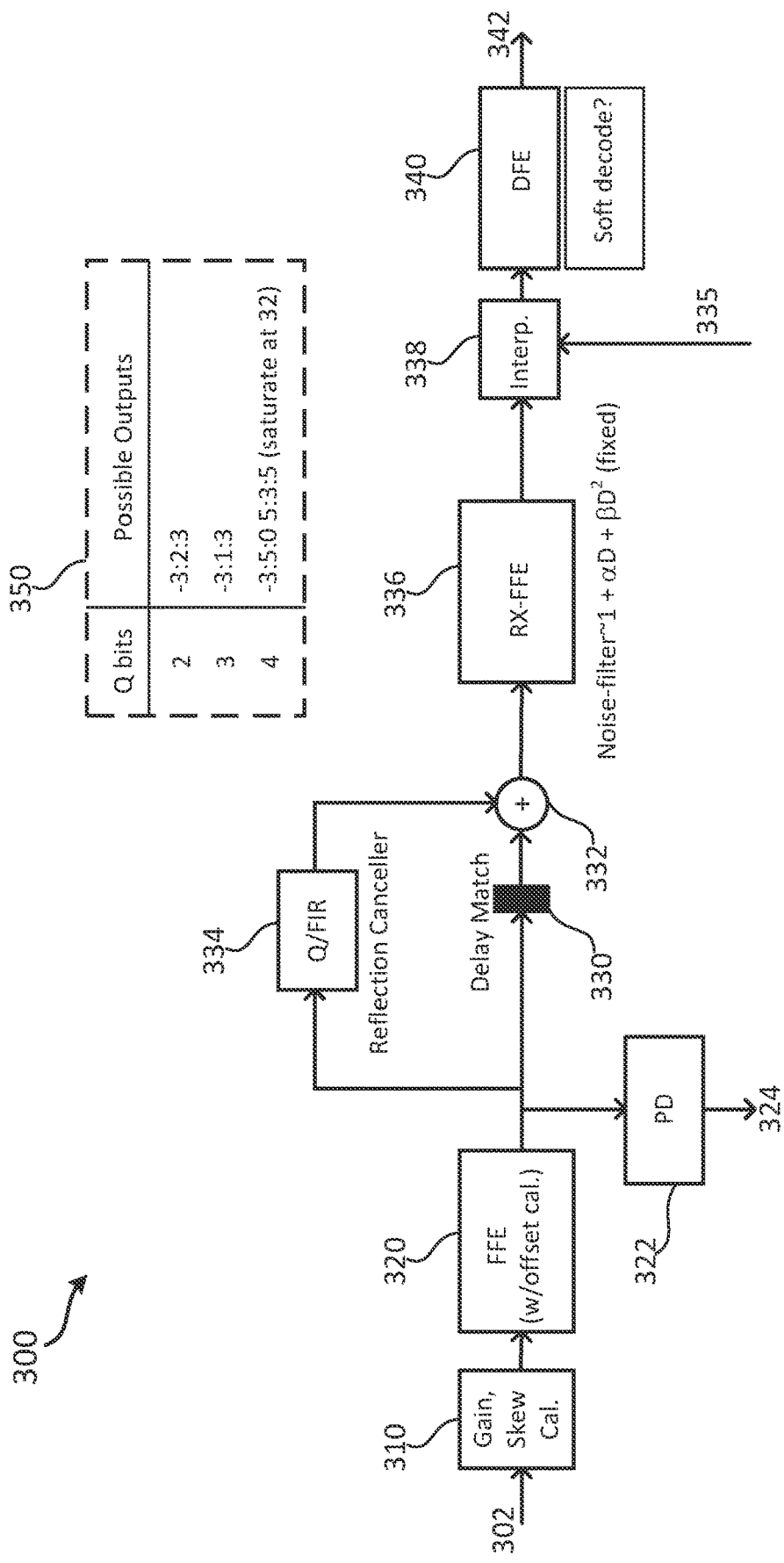
FIG. 3 is a block diagram illustrating an example of a high-performance DSP system, according to various aspects of the subject technology.

FIG. 3 is a block diagram illustrating an example of a high-performance DSP device 300, according to various aspects of the subject technology. The DSP device 300 includes an ADC calibration circuit 310, and FFE circuit 320, a PD 322, a delay-match circuit 330, a reflection canceller 334, a summing circuit 332, an RX-FFE 336, an interpolator 338 and a DFE circuit 340. In some implementations, some components of the DSP device 300 can be implemented in software and/or firmware. The ADC calibration circuit 310 can be a gain-skew calibration circuit and is responsible for calibration of the timing offset and gain errors of the ADC 210. The FFE circuit 320 is a passive equalizer used to undo the channel dispersion and may include offset calibration. The FFE circuit 320 can be implemented as a symbol-spaced FIR filter to reduce distortions due to, for example, channel loss impairments. In some aspects, the FFE circuit 320 can be implemented using multitap filters that create a number of delayed versions of the input signal that are added back to the input signal with the proper weights. In some implementations, the FFE circuit 320 can include offset calibration to calibrate for a timing offset of the digital signal received from the ADC calibration circuit 310. The PD 322 can detect the phase angle signal 324 associated with the output signal from the FFE circuit 320. The phase angle signal 324 can be provided to a CDR circuit (e.g., 230 of FIG. 2).

The output of the FFE 320 includes the original signal transmitted by the transmitter device (e.g., 110 of FIG. 1) plus the edge reflection effect due to the transmission medium (e.g., 115 of FIG. 1) that has to be canceled. The reflection canceller 334 consists of a Q filter followed by an FIR filter with a floating tap structure and is similar to the reflection canceller 236 of FIG. 2. The quantized input to the FIR filter has a narrow bit width resulting in low-cost delay lines and simple multipliers that leads to low overall power and chip area. In other words, the use of the Q filter in front of the FIR filter (also referred to as Q-FIR filter) allows using an FIR with a lower number of bits, for which possible outputs for different values (2, 3 and 4) of a Q bit is given in a table 350. The delay match 330 accounts for the processing delays of the reflection canceller 334 so that the output of the summing circuit 332 is correct. The output of the delay-match circuit 330 is combined with an output of the reflection canceller 334 by the summing circuit 332. The output signal from the summing circuit 332 is passed into the RX-FFE 336, which is similar to the RX-FFE 232 of FIG. 2, as discussed above. For example, the RX-FFE 336 similarly includes a noise-shaping filter that can change the spectral shape of signal and can be characterized by a polynomial transfer function: $1 + \alpha D + \beta D^2$, where D is delay or latency variable and $\alpha$ and $\beta$ are parameters of the transfer function. The value of a is typically between 0 and 1 to implement a low-pass filter to reduce noise. The output of the RX-FFE 336 is passed to an interpolator 338 that can help to achieve a faster timing-recovery. The interpolator 338 can use a phase adjustment signal 335, for example, provided by a CDR circuit (e.g., 230 of FIG. 2). The output of the interpolator 338 is sent to the DFE circuit 340, which is a noise-shaping filter for suppression of quantization noise and has a transfer function similar to that of DFE circuit 240 of FIG. 2, as discussed above. The output of the DSP device 300 is a signal in which the effects of the channel dispersion and reflection are canceled and is sent to an RX data processing circuit (e.g., 128 of FIG. 1) to recover the original data transmitted by the transmitter device (e.g., 110 of FIG. 1).

Figure 4:
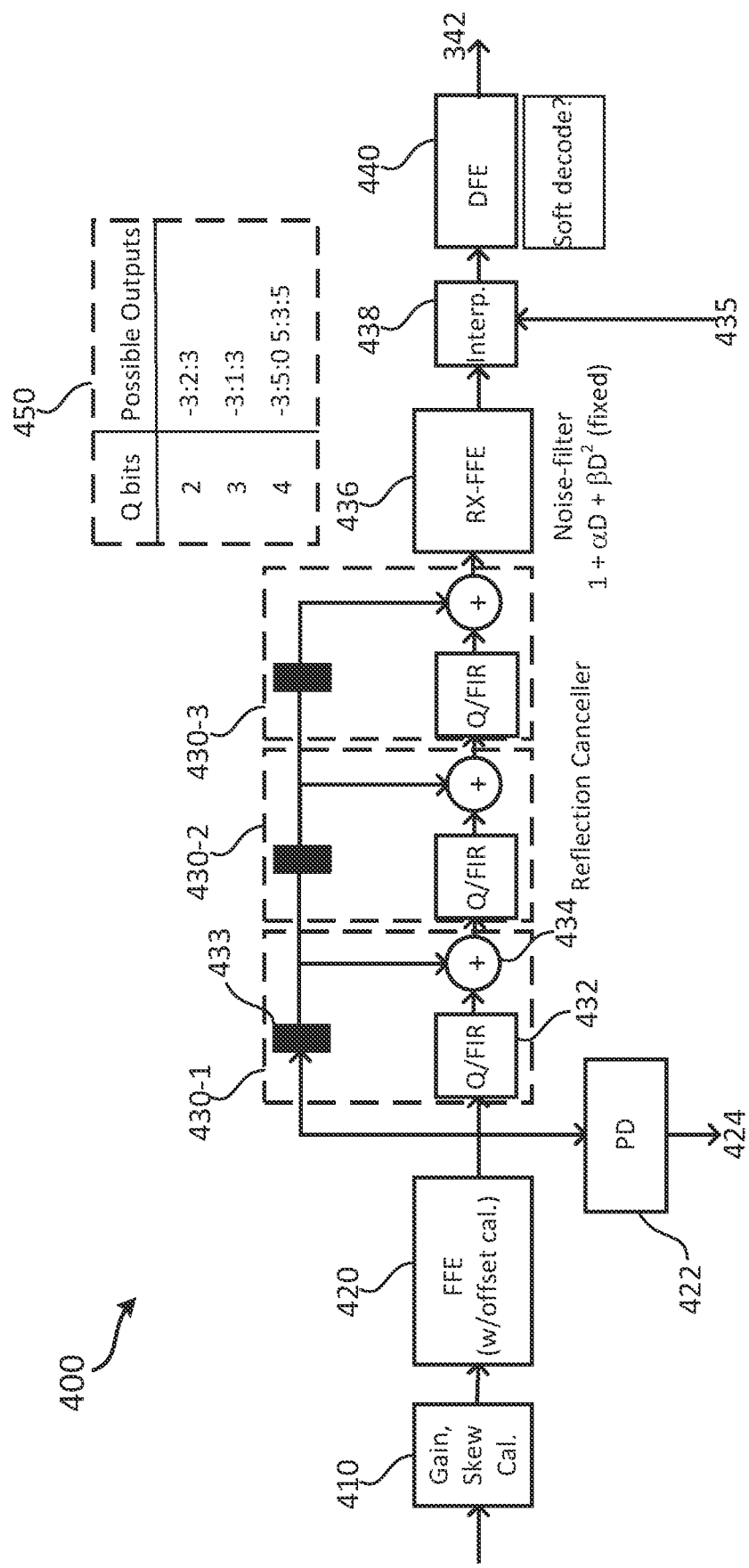
FIG. 4 is a block diagram illustrating an example of a high-performance DSP system, according to various aspects of the subject technology.

FIG. 4 is a block diagram illustrating an example of a high-performance DSP, according to various aspects of the subject technology. The DSP device 400 includes an ADC calibration circuit 410, and FFE circuit 420, a PD 422, a number of (e.g., three) refection canceller stages 430 (430-1, 430-2 and 430-3), an RX-FFE circuit 436, an interpolator 438 and a DFE circuit 440. In some implementations, some components of the DSP device 400 can be implemented in software and/or firmware. The ADC calibration circuit 410 can be a gain-skew calibration circuit and is responsible for calibration of the timing offset and gain errors of the ADC (e.g., 210 of FIG. 2). The FFE circuit 420 is a passive equalizer used to undo the channel dispersion and may include offset calibration. The FFE circuit 420 can be implemented as a symbol-spaced FIR filter to reduce distortions due to, for example, channel loss impairments. In some aspects, the FFE circuit 420 can be implemented using multitap filters that create a number of delayed versions of the input signal that are added back to the signal with the proper weights. In some implementations, the FFE circuit 420 can include offset calibration to calibrate for a timing offset of the digital signal received from the ADC calibration circuit 410. The PD 422 can detect the phase angle signal 424 associated with the output signal from the FEE circuit 420. The phase angle signal 424 can be provided to a CDR circuit (e.g., 230 of FIG. 2).

The output of the FFE circuit 420 includes the original signal transmitted by the transmitter device 110 of FIG. 1) plus the edge reflection effect due to the transmission medium (e.g., 115 of FIG. 1) that has to be canceled. The reflection canceller stages 430 can cancel the edge reflection effect. Each of the reflection canceller stages 430 consists of a Q-FIR filter 432, a delay match 433 and a summing circuit 434, as described above with respect to FIG. 2. The delay match 433 accounts for the delay of the Q/FIR filters 432 so that outputs of the reflection canceller stages 430 are correct. The purpose of using multiple reflection canceller stages 430 is to provide an implementation of an iterative reflection cancellation algorithm. In general, the output of the first Q/FIR filter 432 is a rougher estimate of the reflection, which is used as an input to the second Q/FIR stage. The estimate of the reflection from the second Q/FIR is expected to be a better estimate of the reflection (better performance) and so on. There will be a point beyond which the estimates get no better or "converge". Three stages are shown as a balance between the quality of the estimate of the reflection and the complexity of reflection canceller stages 430. More or fewer stages are also possible. The output signal from the reflection canceller stages 430 is passed into the RX-FFE circuit 436, which is similar to the RX-FFE 232 of FIG. 2, as discussed above. For example, the RX-FFE circuit 436 similarly includes a noise-shaping filter that can change the spectral shape of signal and can be characterized by a polynomial transfer function: $1+D+\beta D^2$, where D is a delay or latency variable and $\alpha$ and $\beta$ are parameters of the transfer function. The value of $\alpha$ is typically between 0 and 1 to implement a low-pass filter to reduce noise. The output of the RX-FFE circuit 436 is passed to an interpolator 438 that can help to achieve a faster timing recovery. The interpolator 438 can use a phase adjustment signal 435, for example, provided by a CDR circuit (e.g., 230 of FIG. 2). The output of the interpolator 438 is sent to the DFE circuit 440, which is a noise-shaping filter for suppression of quantization noise and has a transfer function similar to that of DFE circuit 240 of FIG. 2, as discussed above. The output of the DSP device 400 is a signal in which the effects of the channel dispersion and reflection are canceled, and the signal is sent to an RX data processing circuit (e.g., 128 of FIG. 1) to recover the original data transmitted by the transmitter device (e.g., 110 of FIG. 1).

Figure 5:
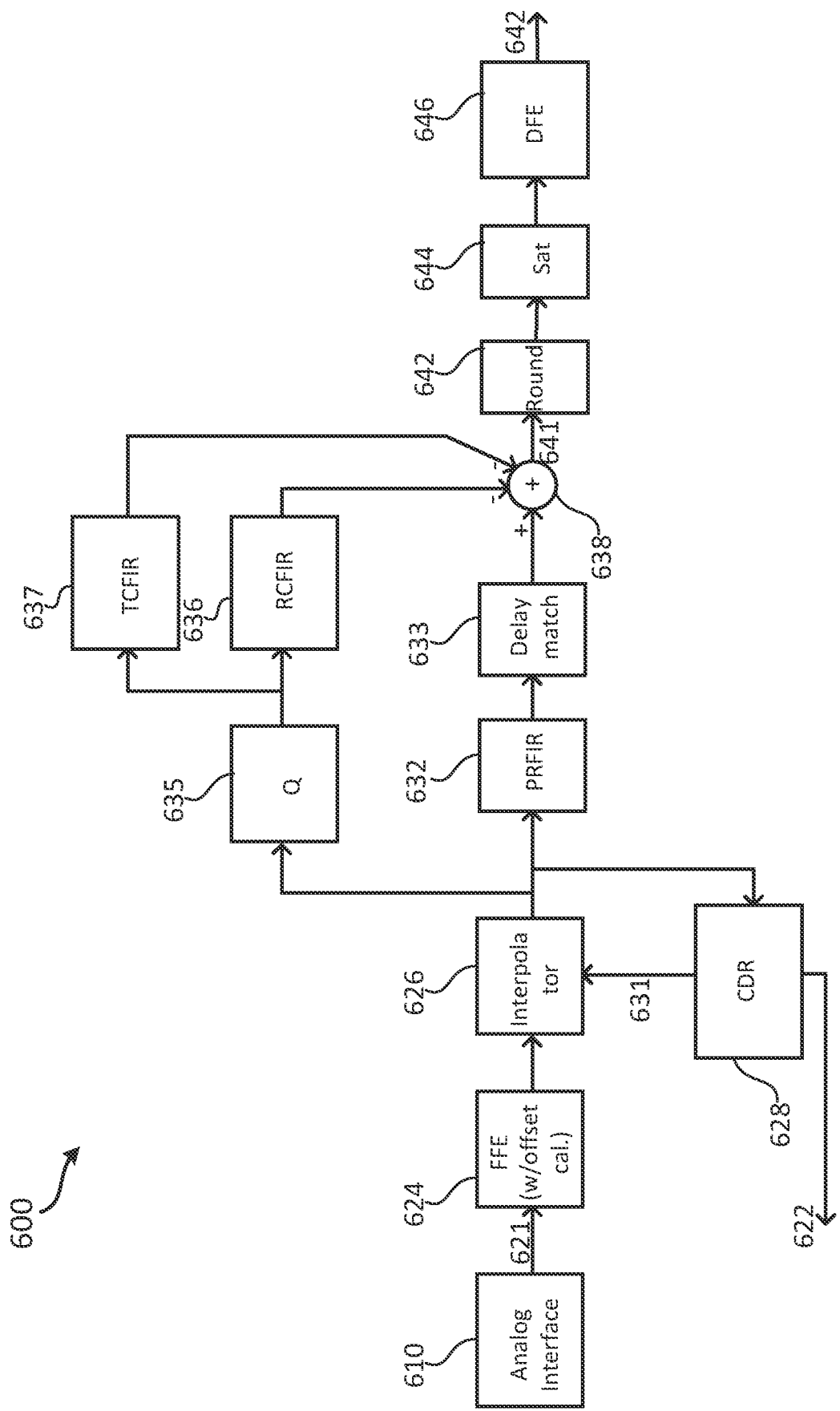
FIG. 5 is a block diagram illustrating an example of a high-performance DSP-based long-reach SERDES, according to various aspects of the subject technology.

FIG. 5 is a block diagram illustrating an example of a high-performance DSP-based long-reach SERDES 600, according to various aspects of the subject technology. The high-performance DSP-based long-reach SERDES 600 is configured as a digital signal processor (DSP) to process digital signals converted from an analog interface 610 through a long-reach transmission medium. The transmission medium, for example, includes solid material like optical fiber or coaxial cable and free space like radio links in various frequency bands. The long-reach transmission medium refers to a medium that can carry signals over considerable distances without substantial loss of integrity or data. In telecommunications and networking, "long-reach" typically contrasts with "short-reach" or "near-end" mediums, which are designed for shorter, often local-area, distances. Using optical fiber used in long-haul telecommunications networks and undersea cable systems as an example, the long-reach means to enable transmission of signals over tens to hundreds of kilometers. For satellite communication, it can enable signals to be transmitted over continental or intercontinental distances by bouncing them off satellites in geostationary or other orbits. The DSP includes a FFE filter 624, an interpolator 626, a CDR circuit 630, a partial-response FIR (PRFIR) filter 632, a delay-match circuit 633, a quantizer 635, a reflection-canceller FIR (RCFIR) filter 636, a tail-canceller FIR (TCFIR) filter 637, an adder 638, and a DFE filter 646. In some implementations, some components of the DSP can be implemented in software and/or firmware.

The FFE filter 624 is, like the FFE circuit 224 shown in FIG. 2, an equalizer used to undo the inter-symbol interference (ISI) in an input signal 621 (a sample digital signal converted by an ADC from the analog signal from the analog interface 610) caused by channel dispersion associated with the long-reach transmission medium. In an embodiment, the FFE filter 624 is configured to be a symbol-spaced filter to reduce distortions due to the channel dispersion associated with the transmission medium. The FFE filter 624 can be implemented as a multitap filter, each tap means a coefficient of the filter for compensating channel response at different point in time, to create a number of delayed versions of the input signal 621 that are added back to the signal with proper weights. Adaptive scheme, e.g., using Least Mean Squares (LMS) algorithm to continue adjust the coefficients during operation. For example, the FFE filter 624 used 12 taps that are added to the input digital signal, e.g., by convolving the input signal 621 with a predetermined filter response defined by the coefficients of the 12 taps, for mitigating the ISI associated with the transmission medium. For long-reach transmission medium, the channel insertion loss becomes much larger, causing significant amounts of ISI that requires more FFE taps. However, for the high-speed communication systems adding a tap means higher-speed hardware, tighter synchronization requirements, and more complex adaptive processing. In an embodiment, the number of taps in the FFE filter 624 is kept the same, and an alternative approach is used to provide efficient digital signal processing with a cost-effective solution to reduce performance loss incurred in the long-reach SERDES 600. In some implementations, the FFE filter 624 can be implemented with a calibration circuit to calibrate for a timing or voltage offset of the input signal 621 to generate a first intermediate signal which is a dispersion-equalized signal for downstream of the long-reach SERDES 600.

The DSP-based SERDES 600 further may include an interpolator 626 for adjustment to the phase of its sampling clocks of the first intermediate signal in very fine increments using a phase adjustment signal 631 to generate a second intermediate signal. The interpolator 626 helps to obtain a faster timing-recovery loop. Since the first intermediate signal is a well-equalized input to the interpolator 626, it results in cost savings in bit resolutions for associated multipliers while still retaining all other capabilities. In the timing-recovery loop, the CDR circuit 630 may employ a phase detector (PD) to detect the phase angle of the second intermediate signal, i.e., an output signal of the interpolator. The CDR circuit 630 may further include a loop filter (LF) and predetermined control logic to generate the phase adjustment signal 231 for the interpolator 626. The phase adjustment signal 631 is used as intermediate samples inserted between original samples according to certain methods of interpolation to increase sample rate. The CDR circuit 630 may also generate an analog control signal 622 via a clock controller for controlling the ADC to convert the analog signal from the analog interface 610.

The output of the interpolator 626, after the timing-recovery process through the CDR circuit 630, includes the original signal transmitted by the transmitter device (e.g., 110 of FIG. 1) with channel dispersion effect being mitigated by the FFE filter 624 while with the channel reflection effect remained due to the transmission medium (e.g., 115 of FIG. 1). The next stage of the DSP-based SERDES, that is configured to undo the channel reflection effect, includes the partial-response FIR (PRFIR) filter 632 and the reflection-canceller FIR (RCFIR) filter 636. The PRFIR filter, 632 is coupled in series to the FFE filter 624 via the interpolator 626. A Partial Response Finite Impulse Response (PRFIR) filter is a specialized type of FIR filter used primarily in digital communication systems to shape transmitted signals and to facilitate more efficient signal detection at the receiver. The concept of "partial response" in this context refers to the intentional introduction of controlled inter-symbol interference (ISI) in the transmitted signal, based on the principle that some forms of ISI can make it easier to detect and decode signals under certain conditions. In an embodiment, the PRFIR filter 632 is implemented as a noise-shaping filter at low latency and can target a partial response for noise shaping, e.g., reshape the filter spectral response or more generally to change a spectral shape of the inter-symbol interferences (ISIs). The PRFIR filter deliberately introduces a known or controlled ISI pattern so that the overall system (transmitter and receiver together) can more effectively deal with the signal impairments caused by the long-reach transmission medium. In a specific embodiment, the PRFIR filter 632 is configured to change the spectral shape by modifying the signal transfer function. For example, introducing a controlled ISI to change a shape of the inter-symbol interference can be accomplished by introducing a characterized polynomial transfer function similar to $1+\alpha D+\beta D^2$, where D is a delay or latency variable and $\alpha$ and $\beta$ are parameters of the transfer function. The value of $\alpha$ is typically between 0 and 1 to implement a low-pass filter to reduce noise attributed to the ISI. Therefore, with the reshaped signal spectrum, most of the signal's channel energy in frequency bands can be placed to where the noise or interference is the least amount. Through these processing scheme, PRFIR filter 632 can be designed to intentionally introduce controlled ISI through the terms in the transfer function, e.g., $\alpha D+\beta D^2$. When combined with appropriate detection techniques (like maximum likelihood sequence estimation), the overall SERDES system can achieve better performance than without the controlled ISI.

In the embodiment of the subject technology for efficiently mitigate the ISI associated with channel reflections, the RCFIR path is provided to couple in parallel to the PRFIR filter 632. The RCFIR path includes a quantizer 635 coupled in series in front of the RCFIR filter 636. The RCFIR filter 636 is configured to cancel or minimize reflections or echoes at various time points including both the long-delay reflections and near-zero reflections in the transmission channel attributed to impedance mismatches or discontinuities. The quantizer 635 provides an algorithm to map a continuous or a large set of values into a finite range such that the large-scale digital signals are quantized with a limited number of discrete values. By placing the quantizer 635 in front of the RCFIR filter 636, a quantized input is provided to the RCFIR filter 635 with a narrow bit width, resulting in low-cost delay lines and simple multipliers that leads to low overall power usage and chip area. In other words, the RCFIR filter 635 can use a lower number of bits. For example, when PAM4 signal modulation is used, outputs of the quantizer 635 may be 2 bits with possible values of 3, 1, −1, −3; or when NRZ modulation mode is used, the Q-bit may be a 1 bit with values of 1, −1.

In an embodiment, the RCFIR filter 636 is configured with a floating tap structure, where each tap coefficient can be dynamically positioned or allocated depending on the specific requirements. By optimizing the tap choices, RCFIR filter 636 can effectively cancel the effect of the channel impairments such as reflection signals that can occur when a signal is transmitted along the transmission medium. For the long-reach transmission medium, the insertion loss becomes much larger, adding taps in the RCFIR filter 636 can avoid power and area increases associated with taps into the FFE filter 624. Normally, taps in the RCFIR filter can cover ISI related to larger delays corresponding to the later time of the echoes from impedance discontinuities. These reflections, which can be categorized as long-delay and near-zero delay reflections, interact with the original signal in different ways, leading to various forms of ISI. Long-delay reflections have a substantial delay relative to the original signal, often amounting to several symbol durations, are typically caused by impedance mismatches in the transmission medium (like cables in wireline networks or atmospheric conditions in wireless networks) that are located far from the transmitter or receiver. This delay means that the reflected signal can interfere with not just the immediately following symbols, but potentially several subsequent symbols, causing a significant smearing of the signal over time. In this disclosure, unlike the existing filter with taps for canceling mostly long-delay reflections, additional taps are added to specifically extend the RCFIR filter 636 to cancel reflections or echoes attributed to ISI with shorter delays. The shorter-delay reflections are echoes received in earlier time or near the main pulse. They are also called near-zero delay reflections. Near-zero delay reflections arise from impedance mismatches close to the transmitter or receiver. These could be due to imperfect connections, abrupt changes in the transmission line characteristics, or other factors that cause a part of the signal to be reflected almost immediately. These near-zero-delay reflections result in more signal distortion rather than the smearing seen with long-delay reflections. They can cause constructive or destructive interference, leading to variations in signal amplitude and phase.

In some embodiments, the RCFIR filter 636 is configured to reduce reflections at various time points using multiple floating taps located from a near-zero negative delay timing point to positive delay timing point including long delay timing point. The near-zero delay includes both positive delay and negative delay. The negative delay ISI is also referred to as "pre-cursor ISI", a symbol at a time point before the main signal pulse. Effectively, the taps associated with negative delays in the RCFIR path can be modeled by modifying taps with longer delay time in the PRFIR path. In some implementations, outputs of RCFIR filter 636 from such negative delays are realized by adding (positive) delays in other paths such as the PRFIR filter. For example, the RCFIR filter 636 includes 20 floating taps to handle 40 input multiplexer lines. The taps start from a delay of −7, a negative delay representing symbol at a position of 7 unit intervals before the main pulse, and maximally reached to the furthest symbol position at 152 post the main pulse. In some implementations, the PRFIR path includes a delay-match circuit 633 following the PRFIR filter 632. The delay-match circuit 633 accounts for the difference between the processing delays of the RCFIR path and the PRFIR path so that the outputs of the PRFIR filter 632 and RCFIR filter 636 can be combined correctly in timing. In the embodiment shown in FIG. 5, the delay-match circuit 633 is configured to enable pre-cursor ISI cancellation by including a term attributed to an added positive delay in the transfer function in PRFIR path, where the added positive delay term corresponds to a negative delay implemented in the path of RCFIR filter 636. Further, the taps may be set every $4^{th}$ symbol, providing a downsampling or reduced rate processing. In some implementations, the extension to lower delays (shorter delays and near-zero delays) can be also done with fixed delay taps. In some implementations, the possible floating tap locations can be shared with reflection taps to achieve more efficient implementations for channels that don't need 100% of both taps.

In another embodiment, the long-reach SERDES 600 further includes a TCFIR filter 637 coupled in parallel with the RCFIR filter 636. TCFIR filter 637 is configured with similar tap with the RCFIR filter 636 and configured to reduce or eliminate the tailing effects or long-duration reflections or echoes in the long-reach transmission medium and ensure that the prolonged effects of signal pulse tails do not interfere with subsequent symbols. These tailing effects or long-duration reflections often are residue ISI due to long-tail interference from analog noise in the input signal caused by increasing insertion loss. In an implementation, the TCFIR filter 637 includes 16 taps, each tap being configured to process eight consecutive symbol durations. The long-reach SERDES 600 further includes an adder 638 configured to combine all the paths from the PRFIR filter 632, the RCFIR filter 636, and the TCFIR filter 637. Note, as shown in FIG. 5, there is a positive sign in the input from PRFIR filter 632 but a negative sign in each of the inputs from either RCFIR filter 636 or TCFIR filter 637. This indicates that the output of the PRFIR filter 632, which comprises original signal that undo the dispersion ISI, is processed to remove the effects of reflection ISI provided in the RCFIR filter 636 or any residue ISI provided in the TCFIR filter 637 by the adder 638. The PRFIR filter 636 added controlled ISI represented by $\alpha D+\beta D^2$. Thus, the output of the adder 638 may be expressed as $1+\alpha D+\beta D^2-$ RCFIR−TCFIR. In some implementations, a half least-significant bit (LSB) may be added in the adder process to facilitate data rounding operations (performed in a round circuit 642) in next step of the signal processing to reduce quantization noise. After the rounding operation, a saturation operation may also be needed in a saturation circuit 644 for systems using fixed-point arithmetic to ensure signals within a representable range.

The output signal 641 from the adder 638 is passed into a DFE filter 646, which is configured to be a noise-shaping filter utilizing both the present and past decisions (symbol estimates) to compensate for channel-induced ISI associated with the long-reach transmission medium. DFE filter 646 corrects for post-cursor ISI by feeding back decisions. In the embodiment, DFE 646 subtracts the terms $\alpha D+\beta D^2$ introduced by the PRFIR filter 632 using estimates of the transmitted symbols derived from the signal at its input. In this way the noise shaping benefits of the PRFIR filter 632 are realized without the penalty of the controlled ISI it introduces. The output signal 642 of the DSP-based SERDES 600 is a signal in which the channel dispersion and reflection effects are undone. The DSP output signal 642 is further sent to an RX data processing circuit (e.g., 128 of FIG. 1) to recover the original data transmitted by the transmitter device (e.g., 110 of FIG. 1).

In some embodiments, the DSP-based long-reach SERDES 600 may include a coupling canceller configured to undo some analog effects of interference between different channels to clean up the signal before performing channel equalization process in the FFE filter 632. In some embodiments, the coupling canceller may be implemented in the FFE filter 632. The DSP configuration in the present disclosure includes extensions of floating taps in RCFIR filter for covering ISI mitigation near the main pulse that enables the DSP-based SERDES to cope with a long range of operation environments such as >200 Gb/s or faster transceiver and high-speed switch applications.

Figure 6:
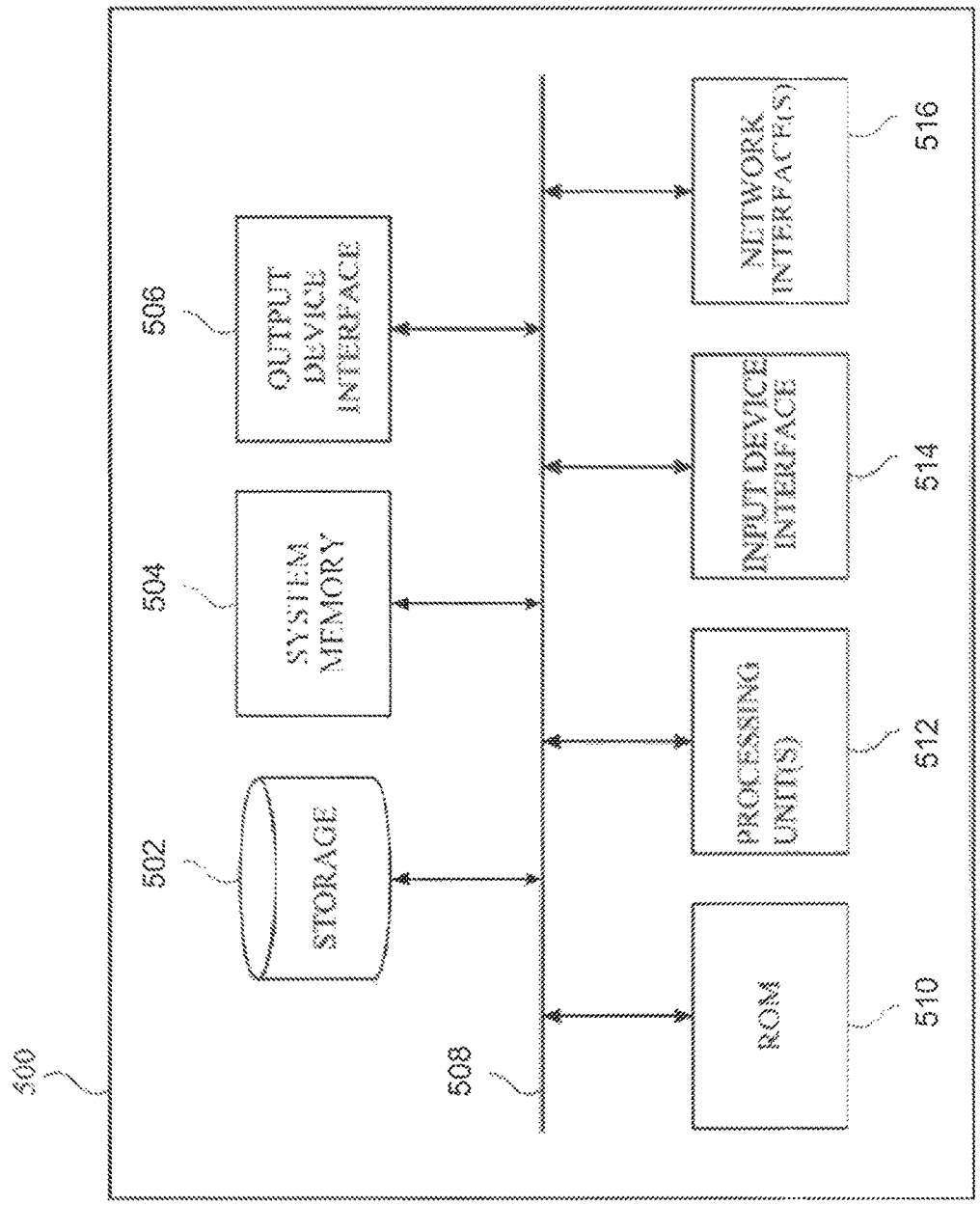
FIG. 6 is an electronic system within which some aspects of the subject technology are implemented.

FIG. 6 is an electronic system within which some aspects of the subject technology are implemented. The electronic system 500 can be, and/or can be a part of, the network switch of a data center or an enterprise network. The electronic system 500 may include various types of computer readable media and interfaces for various other types of computer readable media. The electronic system 500 includes a bus 508, one or more processing unit(s) 512, a system memory 504 (and/or buffer), a ROM 510, a permanent storage device 502, an input device interface 514, an output device interface 506, and one or more network interfaces 516, or subsets and variations thereof.

The bus 508 collectively represents all system, peripheral, and chipset buses that communicatively connect the numerous internal devices of the electronic system 500. In one or more implementations, the bus 508 communicatively connects the one or more processing unit(s) 512 with the ROM 510, the system memory 504, and the permanent storage device 502. From these various memory units, the one or more processing unit(s) 512 retrieves instructions to execute and data to process in order to execute the processes of the subject disclosure. The one or more processing unit(s) 512 can be a single processor or a multi-core processor in different implementations. In one or more aspects, the one or more processing unit(s) 512 may execute software components of the subject technology.

The ROM 510 stores static data and instructions that are needed by the one or more processing unit(s) 512 and other modules of the electronic system 500. The permanent storage device 502, on the other hand, may be a read-and-write memory device. The permanent storage device 502 may be a nonvolatile memory unit that stores instructions and data even when the electronic system 500 is off. In one or more implementations, a mass-storage device (such as a magnetic or optical disk and its corresponding disk drive) may be used as the permanent storage device 502.

In one or more implementations, a removable storage device (such as a floppy disk, flash drive and its corresponding disk drive) may be used as the permanent storage device 502. Similar to the permanent storage device 502, the system memory 504 may be a read-and-write memory device. However, unlike the permanent storage device 502, the system memory 504 may be a volatile read-and-write memory, such as random-access memory (RAM). The system memory 504 may store any of the instructions and data that one or more processing unit(s) 512 may need at runtime. In one or more implementations, the processes of the subject disclosure are stored in the system memory 504, the permanent storage device 502 and/or the ROM 510. From these various memory units, the one or more processing unit(s) 512 retrieves instructions to execute the processes of one or more implementations.

The bus 508 also connects to the input and output device interfaces 514 and 506, The input device interface 514 enables a user to communicate information and select commands to the electronic system 500. Input devices that may be used with the input device interface 514 may include, for example, alphanumeric keyboards and pointing devices (also called "cursor control devices"). The output device interface 506 may enable, for example, the display of images generated by electronic system 500. Output devices that may be used with the output device interface 506 may include, for example, printers and display devices, such as a liquid crystal display a light emitting diode display, an organic light emitting diode display, a flexible display, a flat panel display, a solid-state display, a projector or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech or tactile input.

Finally, as shown in FIG. 6, the bus 508 also couples the electronic system 500 to one or more networks and/or to one or more network nodes, through the one or more network interface(s) 516. In this manner, the electronic system 500 can be a part of a network of computers (such as a local area network, a wide area network, an intranet, or a network of networks, such as the internet). Any or all components of the electronic system 500 can be used in conjunction with the subject disclosure.

Implementations within the scope of the present disclosure can be partially or entirely realized using a tangible computer-readable storage medium (or multiple tangible computer-readable storage media of one or more types) encoding one or more instructions. The tangible computer-readable storage medium also can be nontransitory in nature. The computer-readable storage medium can be any storage medium that can be read, written, or otherwise accessed by a general purpose or special purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONOS, RRAM, NRAM, racetrack memory, FJG and Millipede memory.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A device comprising:
a first filter configured to process an input signal to reduce inter-symbol interference (ISI) associated with channel dispersion through a long-reach transmission medium;
a second filter coupled in series to the first filter and configured to change a shape of the ISI; and
a third filter coupled in parallel with the second filter and configured to cancel ISI associated with both long-delay reflections and near-zero delay reflections.

2. The device of claim 1, wherein the first filter comprises a feed-forward equalizer configured to include a calibration circuit to calibrate for a timing offset of the input signal received from an analog-to-digital converter (ADC) to provide a first intermediate signal for a serializer-deserializer (SERDES).

3. The device of claim 2, wherein the second filter comprises a partial-response finite impulse-response (PR-FIR) filter configured to introduce controlled ISI based on a transfer function, wherein the transfer function contains at least a term associated with added positive delay which corresponds to a negative delay implemented in the third filter.

4. The device of claim 3, further comprising an interpolator configured to adjust a phase of the first intermediate signal outputted from the first filter to output a second intermediate signal based on a phase adjustment signal.

5. The device of claim 4, further comprising a phase detector configured to detect a phase angle of the second intermediate signal from the interpolator, and a loop filter configured to generate the phase adjustment signal.

6. The device of claim 4, wherein the third filter comprises a quantizer and a reflection-canceller finite impulse-response (RCFIR) filter coupled to the quantizer in series, the third filter being coupled to the interpolator and the first filter in parallel with the PRFIR filter.

7. The device of claim 6, wherein the RCFIR filter is configured to cancel reflections using multiple floating taps located from a near-zero negative delay timing point to positive delay timing point including long delay timing point.

8. The device of claim 7, further comprising a fourth filter coupled in parallel with the RCFIR filter and configured to remove residue ISI attributed to analog noise.

9. The device of claim 8, further comprising a delay-match circuit coupled to the PRFIR filter and followed by an adder, the delay-match circuit being configured to enable reduction of negative delay ISI performed in RCFIR filter, the adder being configured to combine a positive output of the second filter with a corresponding negative output of the third filter and the fourth filter and to generate an output signal.

10. The device of claim 9, further comprising a fifth filter coupled to the adder, the fifth filter comprising a decision-feedback equalizer (DFE) configured to process the output signal to remove the controlled ISI added by the second filter.

11. A system comprising:
an analog-to-digital converter (ADC) configured to provide a digital signal converted from an analog signal transmitted through a transmission medium;
a first filter configured to reduce inter-symbol interference (ISI) of the digital signal associated with dispersion in the transmission medium;
a second filter configured to change spectral shape of the ISI; and
a third filter configured to cancel ISI associated with reflections at various timing points in the transmission medium;
wherein the transmission medium comprises a long-reach transmission medium, and the second filter is implemented in a serializer-deserializer (SERDES) with the first filter and in parallel with the third filter.

12. The system of claim 11, wherein the first filter comprises a feed-forward equalizer (FFE) having an offset calibration to provide a first intermediate signal with equalized dispersion.

13. The system of claim 11, wherein the second filter comprises a partial-response infinite impulse-response (PR-FIR) filter configured to introduce controlled ISI based on a transfer function and add the controlled ISI to the first intermediate signal.

14. The system of claim 11, wherein the third filter comprises a quantizer coupled in series with a reflection-canceller finite impulse-response (RCFIR) filter.

15. The system of claim 13, wherein the RCFIR filter is configured to reduce reflections using multiple floating taps located from a near-zero negative delay time point to a positive delay time points including long delays time points, wherein the taps associated with negative delays in the RCFIR filter are modeled by modifying taps with longer delay in the PRFIR filter.

16. The system of claim 15, further comprising a fourth filter coupled in parallel with the third filter and configured to reduce residue ISI attributed to long-tail analog noise.

17. The system of claim 16, further comprises a delay-match circuit coupled to the PRFIR filter and followed by an adder, the delay-match circuit being configured to provide a controlled positive delay ISI through the PRFIR filter to enable reduction of negative delay ISI performed in RCFIR filter, the system further comprising a decision-feedback equalizer to remove the controlled ISI added by the PRFIR filter.

18. A receiver comprising:
a feed-forward equalizer (FFE) configured to equalize signal dispersion associated with a transmission medium;

a filter configured to reduce both long-delay reflections and near-zero delay reflections attributed to inter-symbol interference (ISI) in the transmission medium;

a partial-response finite impulse-response (PRFIR) filter configured to add controlled ISI based on a transfer function; and an interpolator coupled to the FFE and configured to output a phase-adjusted signal to the PRFIR filter, wherein the transmission medium comprises a serializer-deserializer (SERDES) long-reach transmission medium.

19. The receiver of claim 18, wherein the filter comprises a quantizer and a reflection-canceller finite impulse-response (RCFIR) filter coupled in series, the filter being coupled in parallel with the PRFIR filter, wherein the transfer function includes a contribution from an added positive delay ISI which corresponds to a negative delay ISI processed by the RCFIR filter.

20. The receiver of claim 19, comprising an adder coupled to the PRFIR filter and the RCFIR filter and a decision-feedback equalizer (DFE) coupled to the adder, the adder being configured to process outputs from both the PRFIR filter and the RCFIR filter, the DFE being configured to remove the controlled ISI added by the PRFIR filter.

* * * * *